(12) United States Patent
Park et al.

(10) Patent No.: US 11,009,778 B2
(45) Date of Patent: May 18, 2021

(54) CAMERA MODULE

(71) Applicant: LG INNOTEK CO., LTD., Seoul (KR)

(72) Inventors: Dong Wook Park, Seoul (KR);
Myoung Jin An, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/349,038

(22) PCT Filed: Nov. 20, 2017

(86) PCT No.: PCT/KR2017/013194
§ 371 (c)(1),
(2) Date: May 10, 2019

(87) PCT Pub. No.: WO2018/093219
PCT Pub. Date: May 24, 2018

(65) Prior Publication Data
US 2019/0265577 A1     Aug. 29, 2019

(30) Foreign Application Priority Data
Nov. 21, 2016 (KR) .................. 10-2016-0154679

(51) Int. Cl.
*G03B 17/12* (2006.01)
*G03B 17/08* (2006.01)
(Continued)

(52) U.S. Cl.
CPC ............ *G03B 17/12* (2013.01); *G03B 17/08* (2013.01); *H04N 5/225* (2013.01); *H05K 3/30* (2013.01)

(58) Field of Classification Search
None
See application file for complete search history.

(56) References Cited

U.S. PATENT DOCUMENTS 5,501,350 A * 3/1996 Yoshida .................. C23C 22/63
216/101
2005/0116138 A1 6/2005 Hanada et al.
(Continued)

FOREIGN PATENT DOCUMENTS

CN    101334579 A    12/2008
CN    102375295 B     4/2015
(Continued)

OTHER PUBLICATIONS

International Search Report dated Mar. 5, 2018 issued in Application No. PCT/KR2017/013194.
(Continued)

*Primary Examiner* — William B Perkey
(74) *Attorney, Agent, or Firm* — KED & Associates LLP

(57) ABSTRACT

An embodiment of a camera module comprises: a lens portion; a front body on which the lens portion is mounted; a substrate portion arranged to be spaced from the lens portion in a first direction and coupled to the front body; an image sensor arranged on the substrate portion and provided to face the lens portion; a first fastener, one side of which is inserted into the front body such that at least a part of the substrate portion is coupled to the front body; and a first attachment portion arranged between the front body and the substrate portion, wherein the first attachment portion may comprise at least one through-hole formed between the front body and the substrate portion so as to couple the front body and the substrate portion.

20 Claims, 12 Drawing Sheets

(51) Int. Cl.
  *H04N 5/225*  (2006.01)
  *H05K 3/30*  (2006.01)

(56) References Cited

U.S. PATENT DOCUMENTS

| | | |
|---|---|---|
| 2012/0044591 A1 | 2/2012 | Lee |
| 2015/0205186 A1 | 7/2015 | Park et al. |
| 2016/0212308 A1* | 7/2016 | Ahn .................. G03B 17/02 |
| 2017/0307841 A1* | 10/2017 | Nakamura ............. B60R 11/04 |
| 2018/0020140 A1* | 1/2018 | Werthessen ........... G03B 43/00 |
| 2019/0391465 A1* | 12/2019 | Li .......................... G03B 17/12 |

FOREIGN PATENT DOCUMENTS

| | | |
|---|---|---|
| CN | 1058126828 A | 7/2016 |
| DE | 10 2015 201998 | 8/2016 |
| EP | 3 493 518 | 6/2019 |
| JP | 2005-101711 | 4/2005 |
| JP | 2007-174358 | 7/2007 |
| JP | 2010-034668 | 2/2010 |
| JP | 2010-045447 | 2/2010 |
| KR | 10-2011-0048136 | 5/2011 |
| KR | 10-2016-0088098 | 7/2016 |

OTHER PUBLICATIONS

European Search Report dated May 14, 2020 issued in Application No. 17872132.0.
Chinese Office Action dated Oct. 20, 2020 issued in Application 201780071838.1.

* cited by examiner

CAMERA MODULE

CROSS-REFERENCE TO RELATED PATENT APPLICATIONS

This application is a U.S. National Stage Application under 35 U.S.C. § 371 of PCT Application No. PCT/KR2017/013194, filed Nov. 20, 2017, which claims priority to Korean Patent Application No. 10-2016-0154679, filed Nov. 21, 2016, whose entire disclosures are hereby incorporated by reference.

TECHNICAL FIELD

Embodiments relate to a camera module for preventing a focal point position of a lens from deviating from a design range or preventing some components from being deformed or damaged during an assembly procedure.

BACKGROUND ART

The content described in this part merely provides background information related to embodiments and does not constitute the related art.

A camera module for various uses may be installed in a vehicle. For example, a camera module for ensuring rear vision during vehicle parking may be installed on a rear body of the vehicle.

In addition, a camera module may also be used in a vehicle black box that has been recently and very usefully used to track details of accident, cause of accident, and so on when a traffic accident occurs. In accordance with current trends, a camera module has been gradually used as a recognition device for clearly and easily recognize a situation of a blind spot that is difficult to check with the unaided eye by a driver or passenger of a vehicle.

In accordance with recent trends, so called smart cars, that is, vehicles including a collision warning system for pre-detecting and preparing for front and rear collision possibility of a vehicle, a collision avoidance system for directly avoiding collision between driving vehicles by a control device installed in the vehicle instead of by driving of a driver, or the like have been increasingly manufactured and related technologies of the smart cars have been increasingly developed.

Camera modules have been increasingly used as a recognition device of an external situation of such a smart car and, accordingly, in accordance with current trends, vehicle camera modules have been increasingly produced and technologies thereof have also been increasingly developed.

A camera module may include an image sensor that is disposed at a position to face a lens in an optical axis direction. During assembly of the camera module, a focal point of the lens is disposed at a position within a design range on the image sensor.

However, there is the possibility that a position of a focal point of a lens is outside a design range during an assembly procedure of the camera module and, accordingly, there is a need to overcome this.

In addition, some components are deformed or damaged during the assembly procedure of the camera module and, accordingly, there is a need to overcome this.

DISCLOSURE

Technical Problem

Embodiments provide a camera module for preventing a focal point of a lens from being outside a design range or some components from being deformed or damaged during an assembly procedure of the camera module.

The technical objects acquired by this disclosure are not limited to the technical objects mentioned above, and other unmentioned technical objects will be clearly understood by those skilled in the art, to which this disclosure belongs, from the following description.

Technical Solution

In one embodiment, a camera module includes a lens unit, a front body with the lens unit installed thereon, a substrate unit spaced apart from the lens unit in a first direction and coupled to the front body, an image sensor disposed on the substrate unit and configured to face the lens unit, a first coupling element having one side inserted into the front body and configured to couple at least a portion of the substrate unit to the front body, and a first adhesive unit disposed between the front body and the substrate unit, wherein the first adhesive unit couples the front body and the substrate unit and includes at least one through hole formed between the front body and the substrate unit.

In another embodiment, a camera module includes a lens unit, a front body with the lens unit installed thereon, a substrate unit spaced apart from the lens unit in a first direction and coupled to the front body, an image sensor disposed on the substrate unit and configured to face the lens unit, a first coupling element having one side inserted into the front body and configured to couple at least a portion of the substrate unit to the front body, a first adhesive unit disposed between the front body and the substrate unit, configured to couple the front body and the substrate unit, and including at least one through hole formed between the front body and the substrate unit, and a rear body coupled to the front body and configured to accommodate the substrate unit and the image sensor, wherein the substrate unit includes a first substrate having one surface on which the image sensor is installed and that is disposed to face the lens unit, and at least one second substrate disposed to be spaced apart from the first substrate in the first direction, and the front body includes a first protrusion that protrudes in a direction toward the substrate unit, includes a first adhesive surface at an end of the first protrusion, and includes an oxide film that is formed on the first adhesive surface via corrosion.

Advantageous Effects

According to embodiments, when air that is filled in a space formed by the front body and the substrate unit expands while the first adhesive unit is heated in order to be hardened, some of the filled air may be discharged to the outside through the through hole and, accordingly, change in a focal distance of the camera module outside a design range, deformation and damage of the first adhesive unit or the substrate unit and the like due to expansion of air may be prevented.

According to embodiments, the front body and the substrate unit of the camera module may be coupled through the active align procedure and, thus, a focal point of the lens unit coupled to the front body may be disposed at an optimum position of the image sensor installed on the substrate unit, thereby enhancing the image quality of an image captured by the camera module.

BEST MODE

Figure 1:
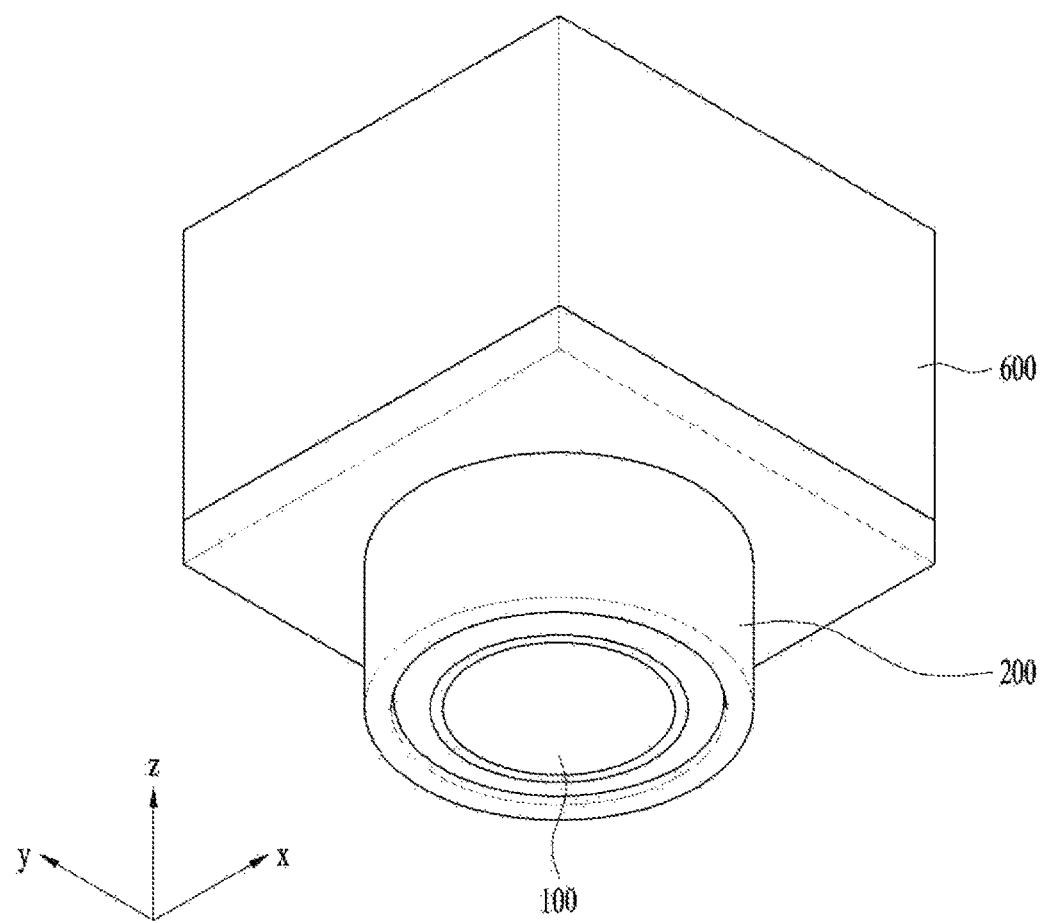
FIG. 1 is a perspective view of a camera module according to an embodiment.

Hereinafter, the embodiments will be described in detail with reference to the accompanying drawings. The embodiments may be modified in various ways and may take various other forms, and specific embodiments will be illustrated in the drawings and described in detail herein. However, this has no intention to limit the embodiments to the specific forms disclosed herein, and it should be understood that all modifications, equivalents, and substitutions may be devised within the spirit and scope of the embodiments.

Although terms such as, for example, "first" and "second" may be used to describe various elements, the elements should not be limited by the terms. These terms are merely used to distinguish the same or similar elements from each other. In addition, the terms particularly defined taking into consideration the configurations and functions of the embodiments are merely given to describe the embodiments and should not be intended to limit the scope of the embodiments.

In the description of the embodiments, it will be understood that, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "on/upper/above" and "beneath/lower/below", used in the following description may be used to distinguish any one substance or element with another substance or element without requiring or containing any physical or logical relationship or sequence between these substances or elements.

In addition, in the drawings, the orthogonal coordinate system (x, y, z) may be used. In the drawings, the x-axis and the y-axis define a plane orthogonal to the optical axis. For convenience, the optical-axis direction (the z-axis direction) may be referred to as a "first direction", the x-axis direction may be referred to as a "second direction", and the y-axis direction may be referred to as a "third direction".

Figure 2:
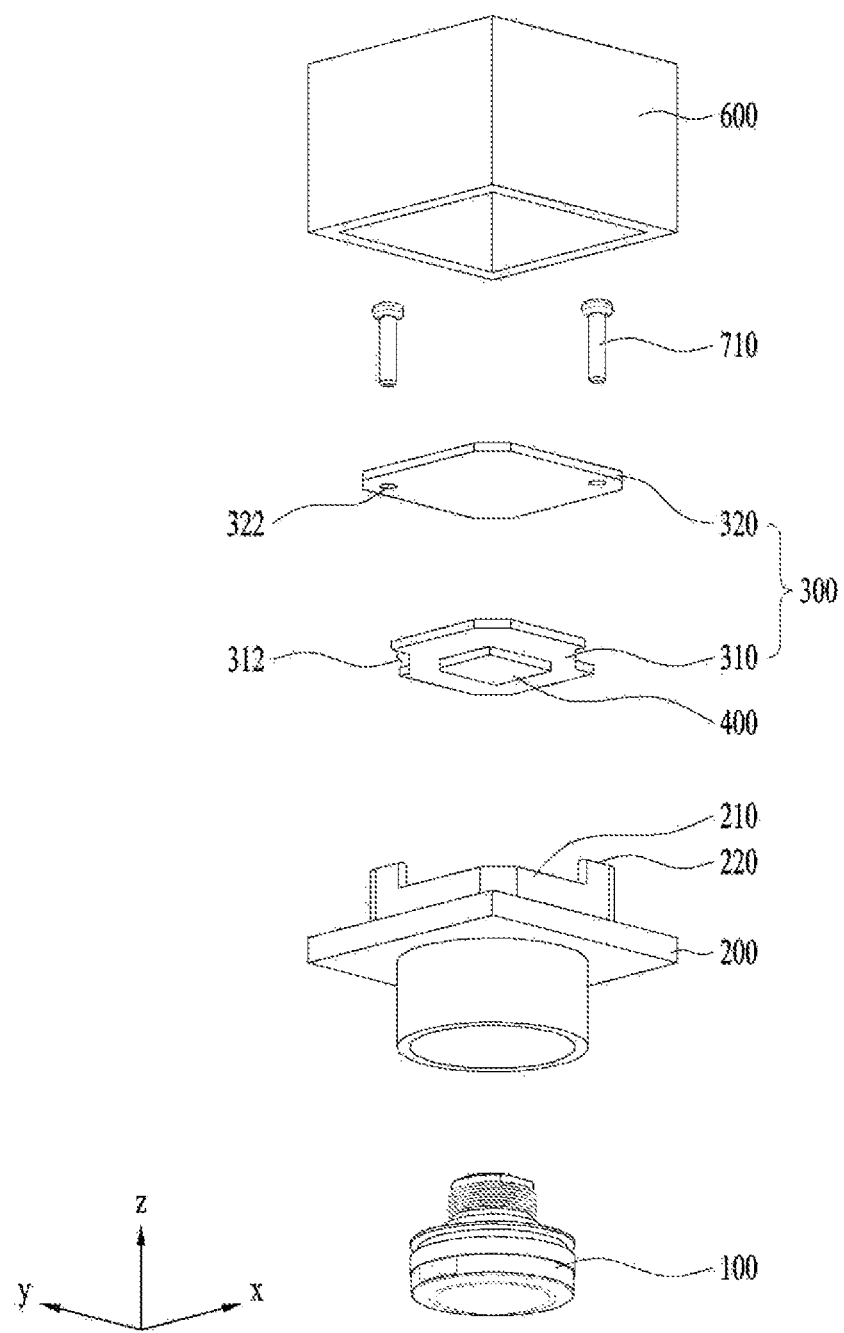
FIG. 2 is an exploded perspective view of a camera module according to an embodiment.
Figure 3:
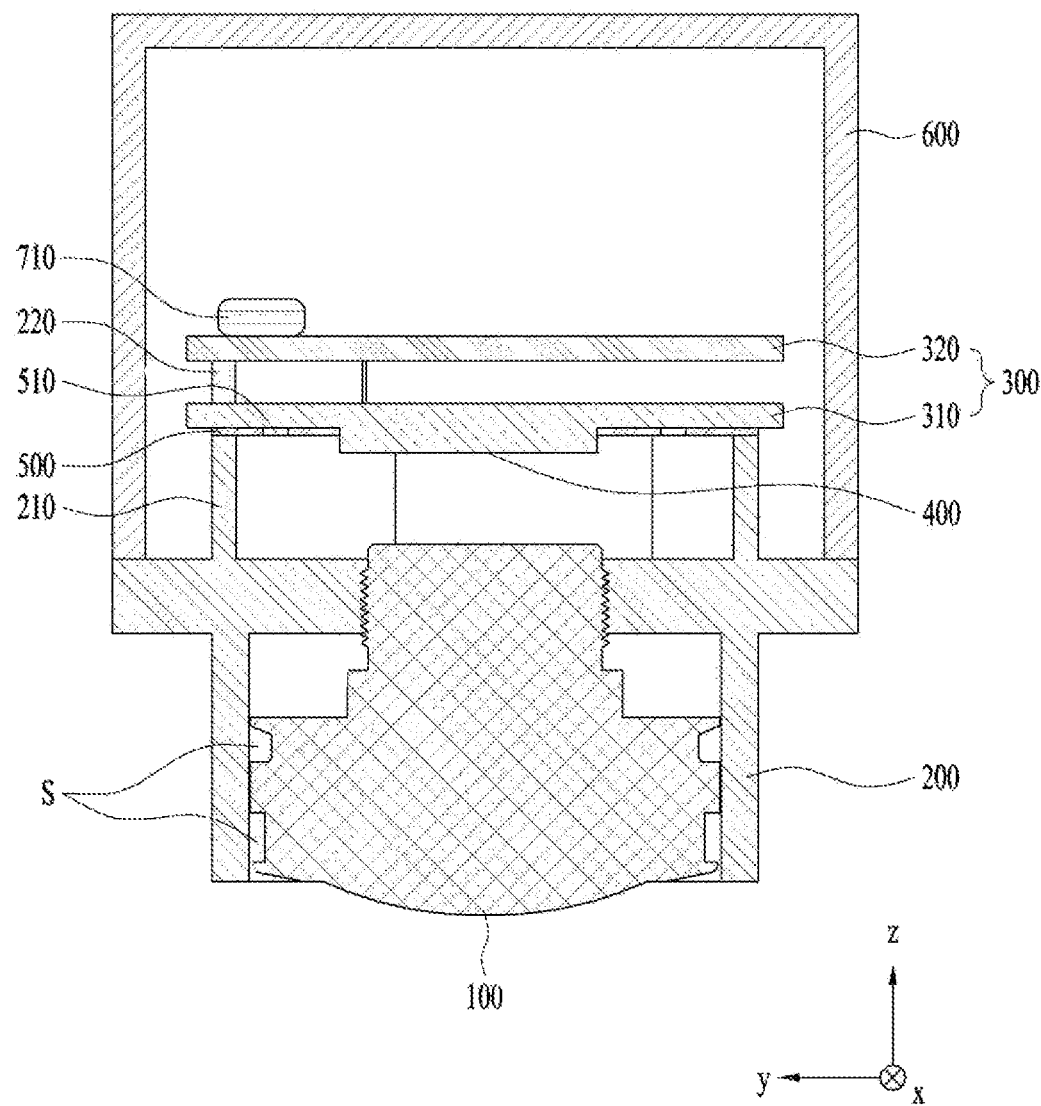
FIG. 3 is a cross-sectional view of a camera module according to an embodiment.

FIG. 1 is a perspective view of a camera module according to an embodiment. FIG. 2 is an exploded perspective view of a camera module according to an embodiment. FIG. 3 is a cross-sectional view of a camera module according to an embodiment. For clear description, a first adhesive unit 500 is omitted in FIG. 2.

The camera module according to an embodiment may include a lens unit 100, a front body 200, a substrate unit 300, an image sensor 400, the first adhesive unit 500, a rear body 600, and a first coupling element 710.

The lens unit 100 may be disposed on a front side of the camera module and, light emitted from the outside of the camera module may be transmitted through the lens unit 100 and may be incident on the image sensor 400 that is disposed to face the lens unit 100 in a first direction.

The lens unit 100 may include at least one lens or two or more lenses may be aligned in an optical axis direction to form an optical system. The lens unit 100 may be installed on the front body 200.

As shown in FIG. 3, a coupling method of the lens unit 100 and the front body 200 may be, for example, a screw coupling method. That is, a female screw thread may be formed on a hollow portion of the front body 200 and a male screw thread may be formed on an outer circumferential surface of the lens unit 100 and, thus, the lens unit 100 and the front body 200 may be coupled to each other.

Water or other impurities may be introduced into the camera module through a gap present at a coupling portion between the lens unit 100 and the front body 200 and, thus, a sealing device such as an o-ring may be installed in order to prevent this. For example, the sealing device may be installed in a space portion S formed between the hollow portion of the front body 200 and the outer circumferential surface of the lens unit 100, as shown in FIG. 3.

The lens unit 100 may be installed on the front body 200 and may be coupled to the rear body 600 to form a space in which the substrate unit 300 is accommodated. As shown in FIGS. 1 and 2, a flange may be formed to protrude on a side surface of the front body 200 in order to be coupled with the rear body 600, as shown in FIGS. 1 and 2.

The flange of the front body 200 may be coupled to an end of the rear body 600, and the flange of the front body 200 and the end of the rear body 600 may be coupled to each other by, for example, adhesives or the front body 200 and the rear body 600 may be formed of a metallic material and may be coupled to each other via fusion or the like.

In order to prevent impurities from penetrating the coupling portion between the front body 200 and the rear body 600, the coupling portion needs to be sealed. Accordingly, when the front body 200 and the rear body 600 are coupled to each other via adhesion, fusion, or the like, the coupling portion may be sealed.

According to another embodiment, the front body 200 and the rear body 600 may also be coupled to each other using a coupling element such as a bolt. In this case, a gasket or the like may be installed at the coupling portion between the front body 200 and the rear body 600 to prevent impurities from penetrating the camera module.

The substrate unit 300 may be spaced apart from the lens unit 100 in a first direction, may be coupled to the front body 200, and may include a first substrate 310 and a second substrate 320.

The image sensor 400 may be installed on one surface of the first substrate 310, and one surface on which the image sensor 400 is installed may be disposed to face the lens unit 100. The first substrate 310 may be electrically connected to the second substrate 320, and may include various devices and circuit wirings for transmitting and receiving an electrical signal to and from the second substrate 320.

In particular, the second substrate 320 may include a power supply device for supplying power to the first substrate 310, and the power supply device may be electrically connected to an external power source. Although FIGS. 2 and 3 illustrate the case in which one second substrate 320 is configured, a plurality of second substrates that are spaced apart from each other in the first direction may be configured according to another embodiment.

The first substrate 310 may be coupled to the front body 200 by the first adhesive unit 500, and the second substrate 320 may be coupled to the front body 200 by the first coupling element 710. A coupling structure of the first adhesive unit 500, the first substrate 310, and the front body 200 will be described below in detail.

As shown in FIGS. 2 and 3, the first coupling element 710 may have one side inserted into the front body 200 and may couple at least a portion of the substrate unit 300, i.e., the second substrate 320 to the front body 200. For example, the first coupling element 710 may include a screw coupling bolt having one side on which a screw thread is formed and the other side on which a head is formed.

In order to insert the one side of the first coupling element 710 into the front body 200, a second protrusion 220 may be formed on the front body 200.

That is, the front body 200 may include a first protrusion 210 that protrudes in a direction toward the substrate unit 300 and includes a first adhesive surface 211 at an end of the first protrusion 210. In this case, the second protrusion 220 may protrude in a direction toward the substrate unit 300 from the first protrusion 210 and may include a first insertion groove 221 (refer to FIG. 8) into which one side of the first coupling element 710 is inserted.

As shown in FIG. 2, a first through hole 322 that the first coupling element 710 penetrates may be formed in the second substrate 320.

The second substrate 320 may be coupled to the second protrusion 220 by the first coupling element 710. That is, the first coupling element 710 may penetrate the first through hole 322 formed in the second substrate 320 and may have one end that is inserted into the first insertion groove 221 formed in the second protrusion 220 and, thus, the second substrate 320 may be coupled to the second protrusion 220 in a state in which the second substrate 320 contacts an end of the second protrusion 220.

As shown in FIG. 2, a first escape groove 312 having a shape corresponding to the second protrusion 220 may be formed in the first substrate 310. Accordingly, the first escape groove 312 may be formed in the first substrate 310 and, thus, the first substrate 310 may be disposed adjacent to an end of the first protrusion 210 disposed below the first substrate 310 without being interrupted by the second protrusion 220.

The first substrate 310 and the second substrate 320 each include various devices and circuit wirings and, thus, may be spaced apart from each other in order to prevent the devices from being damaged or circuit wirings from being short-circuited if the devices or the circuit wirings contact each other.

The second protrusion 220 may space the first substrate 310 and the second substrate 320 apart from each other in the first direction by a predetermined distance. That is, the second protrusion 220 may protrude from the first protrusion 210 in the first direction, and the first substrate 310 may be disposed adjacent to an end of the first protrusion 210. The second substrate 320 may be disposed at a position that contacts an end of the second protrusion 220.

Due to this structure, the first substrate 310 and the second substrate 320 may be spaced apart from each other in the first direction by a predetermined distance by the second protrusion 220. The predetermined distance in the first direction between the first substrate 310 and the second substrate 320 may be adjusted by appropriately adjusting the length of the second protrusion 220 in the first direction.

The image sensor 400 may be disposed on the substrate unit 300 and may be configured to face the lens unit 100. Light transmitted through the lens unit 100 may be incident on the image sensor 400 and the image sensor 400 may capture an image of a subject.

The image captured by the image sensor 400 may be converted into an electrical signal and may be transmitted to an external display device, a storage device, or the like.

The rear body 600 may be coupled to the front body 200 and may accommodate the substrate unit 300 and the image sensor 400 therein. The rear body 600 may be configured in the form of a box shape with an open one side and may be coupled to the flange included in the front body 200 at an end of the open one side.

As described above, the rear body 600 may be coupled to the front body 200 and may form a space for accommodating the substrate unit 300 and the image sensor 400 therein.

Figure 4:
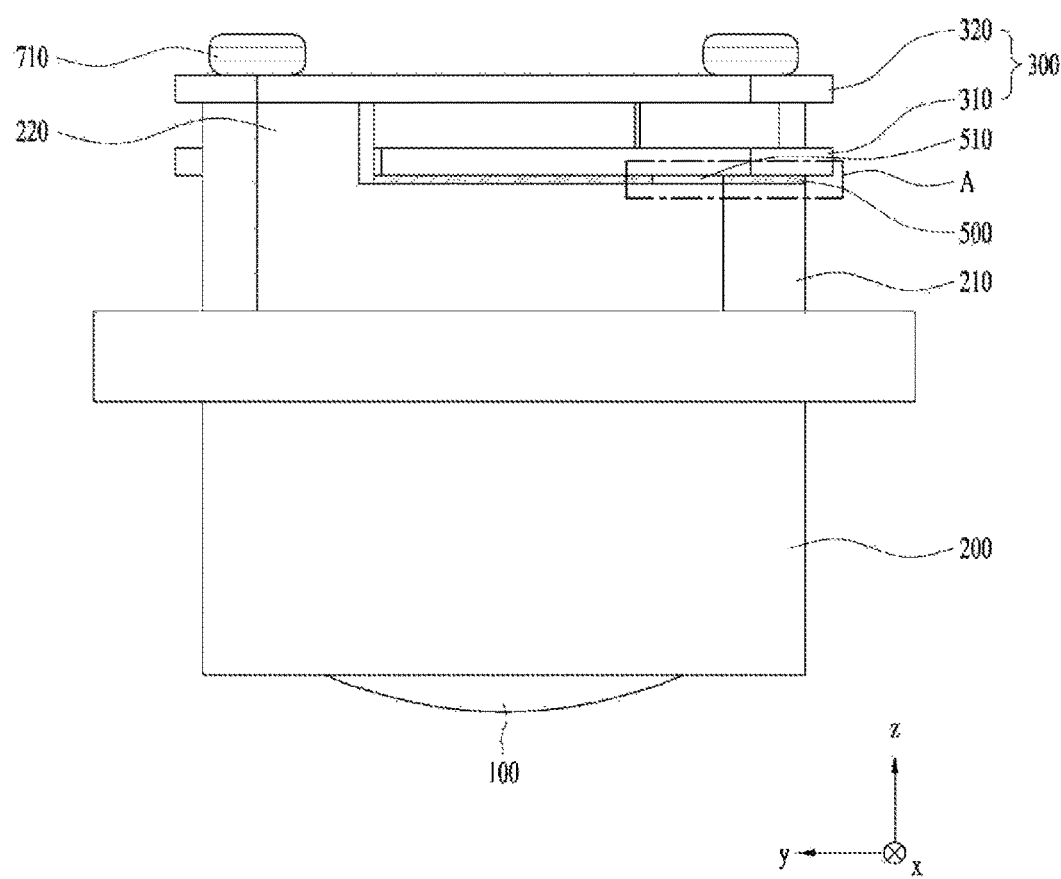
FIG. 4 is a side view showing the case in which a rear body is removed from a camera module according to an embodiment.
Figure 5:
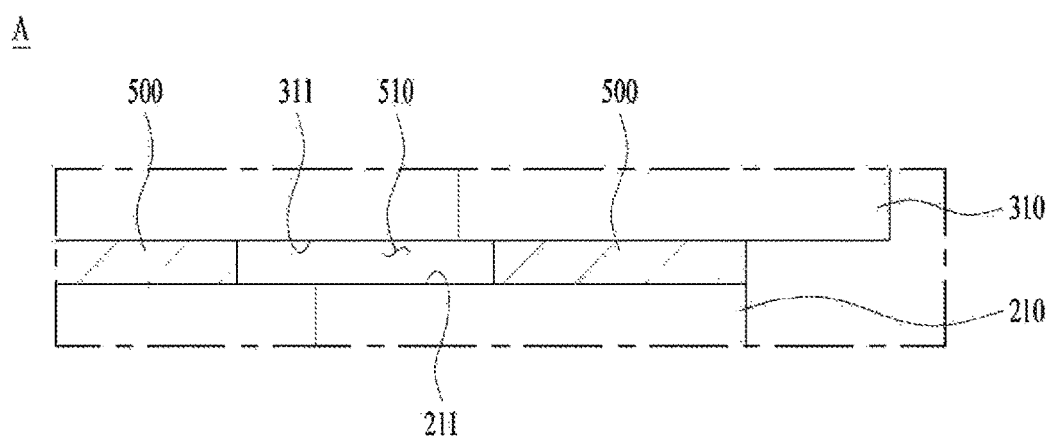
FIG. 5 is an enlarged view of a portion A of FIG. 4.

FIG. 4 is a side view showing the case in which the rear body 600 is removed from a camera module according to an embodiment. FIG. 5 is an enlarged view of a portion A of FIG. 4.

The first adhesive unit 500 may be disposed between the front body 200 and the substrate unit 300. The first adhesive unit 500 may couple the front body 200 and the substrate unit 300, e.g., the first substrate 310 to each other.

The front body 200 may include the first protrusion 210 that protrudes in a direction toward the substrate unit 300 and the first protrusion 210 may include the first adhesive surface 211 disposed at an end thereof. In this case, the first adhesive surface 211 may refer to an end surface of the first protrusion 210.

The first substrate 310 may include a second adhesive surface 311 at a portion facing the first adhesive surface 211. In this case, the second adhesive surface 311 may refer to a surface of the first substrate 310, on which the image sensor 400 is installed.

The first adhesive unit 500 may be formed by coating adhesives on the first adhesive surface 211 or the second adhesive surface 311. That is, the first adhesive unit 500 may be formed by coating adhesives on the first adhesive surface 211, coating adhesives on the second adhesive surface 311, or coating adhesives on both the first adhesive surface 211 and the second adhesive surface 311.

In this case, when the first adhesive unit 500 is formed by coating adhesives only on the second adhesive surface 311, the adhesives may be coated on the second adhesive surface 311 in a shape corresponding to a shape of the first adhesive surface 211.

At least one through hole 510 may be formed between the front body 200 and the substrate unit 300. As shown in FIGS. 4 and 5, the through hole 510 may be formed in one side of the first adhesive unit 500.

That is, the first adhesive unit 500 may be formed by coating adhesives on portions of the first adhesive surface 211 and/or the second adhesive surface 311 in such a way that a portion on which adhesives are not coated is formed as the through hole 510 rather than coating adhesives in the form of one complete closed curve on the first adhesive surface 211 and/or the second adhesive surface 311. That is, the first adhesive unit 500 may be formed like an open curve.

The through hole 510 is formed in the first adhesive unit 500 and, thus, when the first adhesive unit 500 is heated to harden the first adhesive unit 500, the front body 200 and the substrate unit 300 are coupled and, then, the front body 200 and the rear body 600 are coupled and, accordingly, some of air that is filled in a space formed by the front body 200 and the substrate unit 300 and expands due to heating may be discharged to the outside through the through hole 510.

That is, the through hole 510 may connect the space formed by the front body 200 and the substrate unit 300 to the outside and, thus, when air present in the space formed by the front body 200 and the substrate unit 300 is heated, some of the air may be moved to the outside.

Due to this structure, when the first adhesive unit 500 is heated, deformation of the substrate unit 300, change in a focal distance of the camera module, and the like, which are caused due to expansion of air present in the space formed by the front body 200 and the substrate unit 300, may also be prevented.

According to an embodiment, when air that is filled in the space formed by the front body 200 and the substrate unit 300 expands while the first adhesive unit 500 is heated in order to be hardened, some of the filled air may be discharged to the outside through the through hole 510 and, accordingly, change in a focal distance of the camera module outside a design range, deformation and damage of the first adhesive unit 500 or the substrate unit 300, and the like due to expansion of air may be prevented.

The front body 200 and the substrate unit 300 may be coupled by the first adhesive unit 500 using an active align procedure and, in this regard, in order to easily perform the active align procedure, the first adhesive unit 500 may include adhesives formed of thermosetting and ultraviolet (UV) curable materials.

The active align procedure may be a procedure in which the substrate unit 300 is moved in the first direction to adjust a focal distance between the lens unit 100 and the image sensor 400 that face each other or the substrate unit 300 is tilted, i.e., is rotated on the x-y plane perpendicular to the first direction to adjust the focal distance between the lens unit 100 and the image sensor 400, according to an embodiment.

In order to perform the active align procedure, the first adhesive unit 500 may be pre-hardened while the active align procedure is performed, and a permanent hardening procedure may be performed on the first adhesive unit 500 after the active align procedure is completely performed Accordingly, adhesives for forming the first adhesive unit 500 may be, for example, hybrid adhesives that react with both UV and heat and is hardened.

During the active align procedure, UV may be irradiated to the first adhesive unit 500 to pre-harden the first adhesive unit 500 in a state in which a focal distance between the lens unit 100 and the image sensor 400 is adjusted.

After the active align procedure is completely performed, the first adhesive unit 500 may be heated to permanently harden the first adhesive unit 500. In this case, for example, the first adhesive unit 500 may be heated using an oven or the like.

According to an embodiment, the front body 200 and the substrate unit 300 of the camera module may be coupled through the active align procedure and, thus, a focal point of the lens unit 100 coupled to the front body 200 may be disposed at an optimum position of the image sensor 400 installed on the substrate unit 300, thereby enhancing the image quality of an image captured by the camera module.

Figure 6:
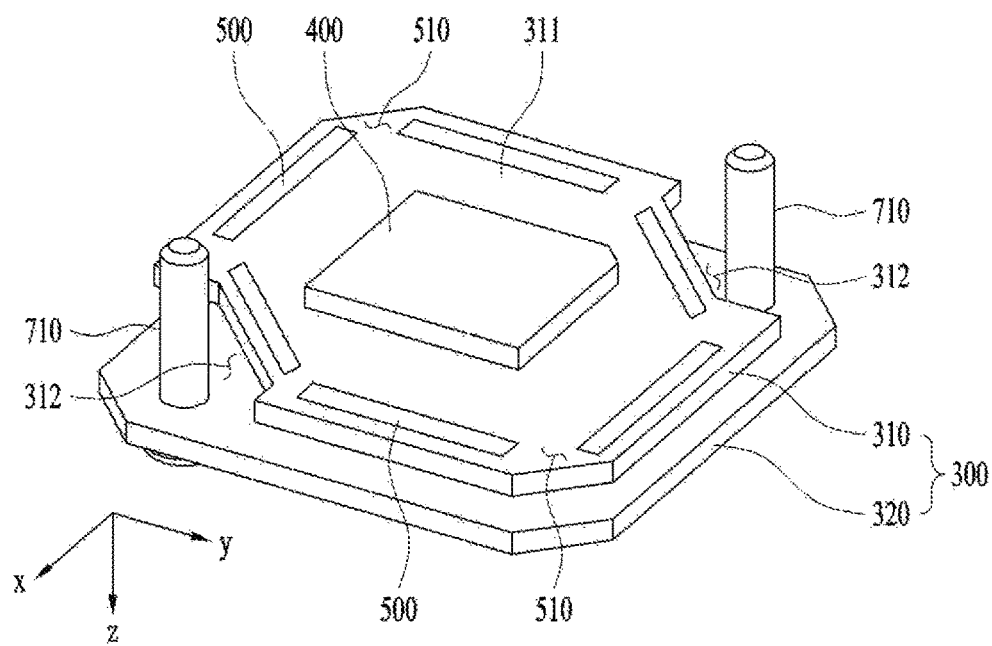
FIG. 6 is a diagram showing the substrate unit 300 and the first adhesive unit 500 according to an embodiment.
Figure 7:
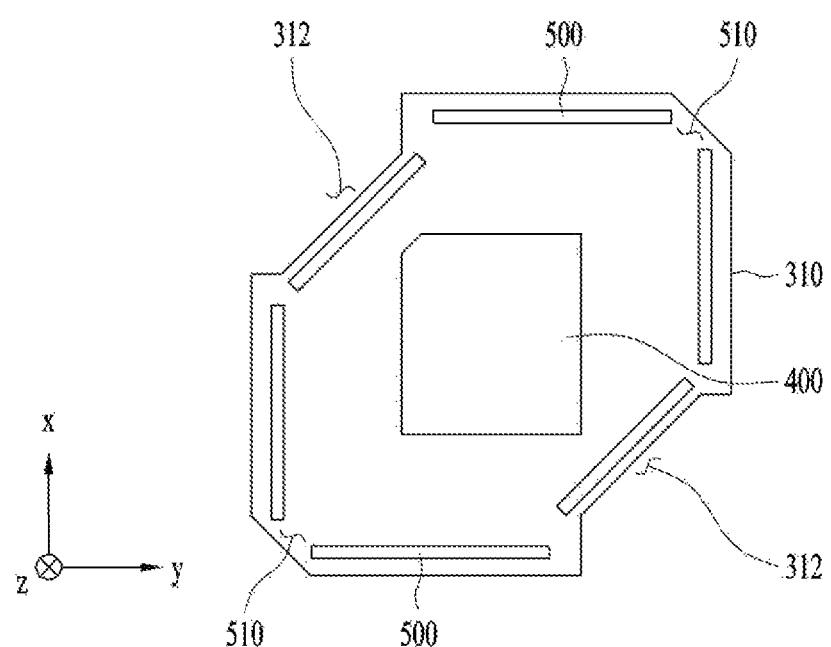
FIG. 7 is a plan view showing the first substrate of FIG. 6.
Figure 8:
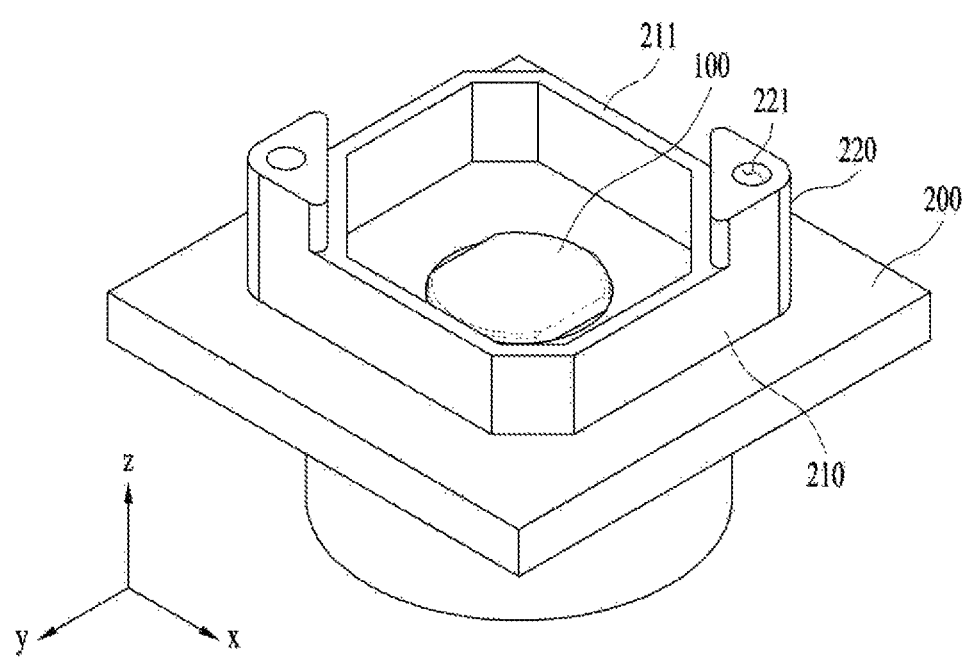
FIG. 8 is a diagram showing the lens unit and the front body according to an embodiment.

FIG. 6 is a diagram showing the substrate unit 300 and the first adhesive unit 500 according to an embodiment. FIG. 7 is a plan view showing the first substrate 310 of FIG. 6. FIG. 8 is a diagram showing the lens unit 100 and the front body 200 according to an embodiment.

As shown in FIGS. 6 and 7, the first escape groove 312 may be formed in the first substrate 310 in a shape corresponding to the second protrusion 220 and, accordingly, the first substrate 310 may be inserted between one pair of the second protrusions 220 via press fitting.

As shown in FIG. 8, the first adhesive surface 211 may be configured in an octagonal shape including long and short sides, viewed in the first direction. As shown in FIGS. 6 and 7, the first adhesive unit 500 may be configured on the second adhesive surface 311 to surround the image sensor 400, and the plurality of through holes 510 that are spaced apart from each other may be formed in the first adhesive unit 500.

However, although FIGS. 6 and 7 illustrate the case in which the first adhesive unit 500 is formed by coating adhesives on the second adhesive surface 311, the first adhesive unit 500 may be formed by coating adhesives on the first adhesive surface 211 or coating adhesives on both the first adhesive surface 211 and the second adhesive surface 311 according to other embodiments.

The shape, position, number, and the like of the through hole 510 shown in FIGS. 6 and 7 are merely an embodiment and, the shape, position, number, and the like of the through hole 510 may be variously selected and the through hole 510 may be disposed in the first adhesive unit 500.

In order to increase coupling strength between the first adhesive surface 211 and the first adhesive unit 500, the first adhesive surface 211 may be configured to increase surface roughness.

For example, the surface roughness of the first adhesive surface 211 may be increased via machining. According to another embodiment, when the first protrusion 210 is formed of a metallic material, an oxide film may be formed on the first adhesive surface 211.

In this case, the oxide film may be formed by corrosion of a surface of the first adhesive surface 211. The surface roughness of the first adhesive surface 211 may be increased by the oxide film and, thus, coupling force between the first adhesive surface 211 and the first adhesive unit 500 may be enhanced.

FIGS. 9 to 14 are flowcharts for explanation of a method of assembling a camera module. Hereinafter, the camera module assembly method according to an embodiment will be described in terms of a method of coupling the substrate unit 300 to the front body 200 using an active align procedure.

When the substrate unit 300 is coupled to the front body 200, a focal point of the lens unit 100 coupled to the front body 200 may be disposed at an optimum position of the image sensor 400 installed on the substrate unit 300. Accordingly, according to an embodiment, a plurality of pieces of information on a focal point may be acquired to determine an optimum position while a position at which a focal point of the lens unit 100 is disposed is adjusted through the active align procedure and, the substrate unit 300 may be coupled to the front body 200 at the determined position.

In the camera module assembly method, the front body 200 to which the lens unit 100 is coupled may be fixed and, the substrate unit 300 may be configured to be moved with respect to the front body 200 during the camera module assembly procedure. According to another embodiment, the substrate unit 300 may be fixed and, the front body 200 to which the lens unit 100 is coupled may be configured to be moved.

That is, the substrate unit 300 or the front body 200 may be configured to be rotated around axes that are in parallel to first, second, and third directions and to be moved in parallel to the first, second, and third directions, during at least a portion of the camera module assembly procedure.

This may be embodied through an assembly device for performing the active align procedure.

The camera module assembly method may include preparation operation S100, adhesives coating operation S200, a focal point adjusting operation, and adhesives hardening operation S500. In addition, the method may include preparation operation S100, adhesives coating operation S200, the focal point adjusting operation, adhesives hardening operation S500, and adhesives coating and hardening operation S600 of the through hole 510.

After adhesives coating operation S200 is completed, an align operation may be performed. In the align operation, the adhesives may be positioned between a first surface of the front body 220 and a second surface of the substrate unit. In this case, the first and second surfaces may face each other and may be surfaces that are coupled to each other via adhesives.

The focal point adjusting operation may be performed only once or may be performed twice or more. According to an embodiment, the focal point adjusting operation may include primary focal point adjusting operation S300 and secondary focal point adjusting operation S400. The focal point adjusting operation may be performed only once and, but may be divided into primary and secondary operations and a plurality of focal point adjusting operations may be performed in order to more precisely adjust a focal point.

Figure 9:
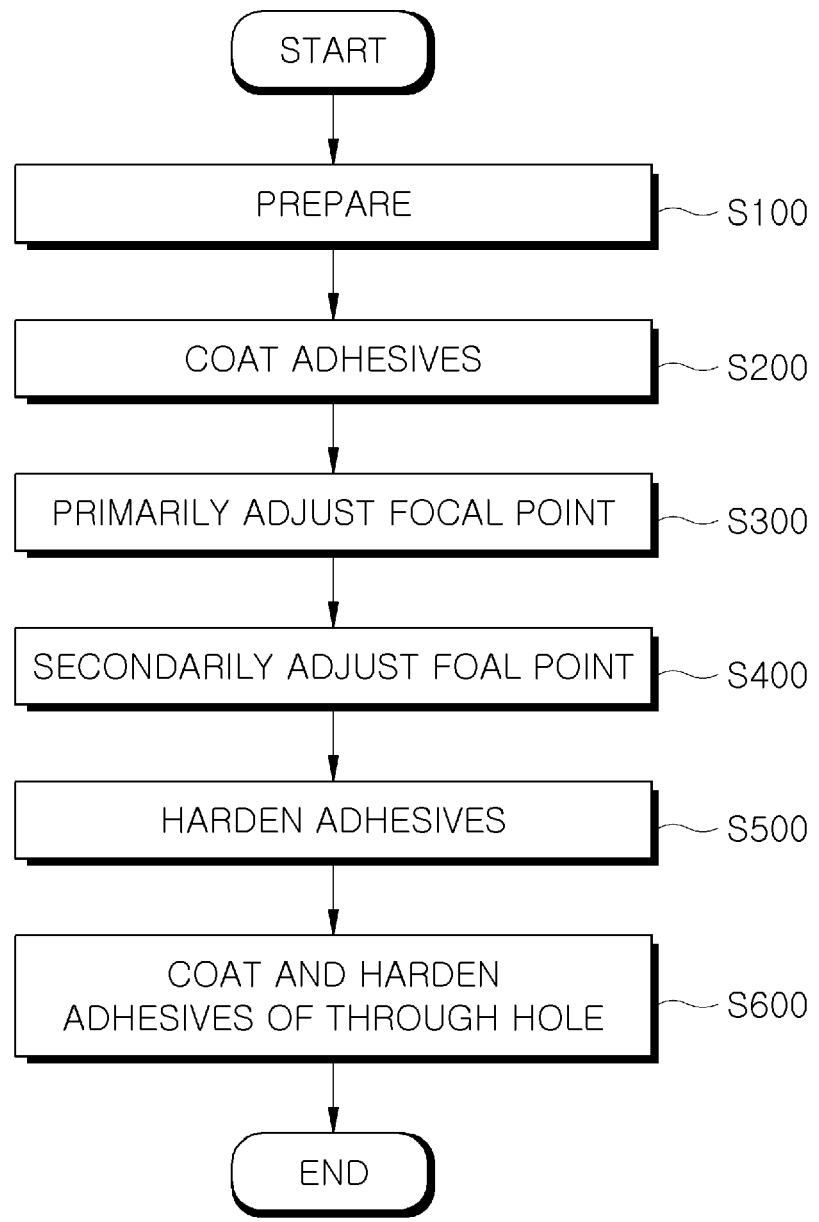
FIGS. 9 to 14 are flowcharts for explanation of a method of assembling a camera module.
Figure 10:
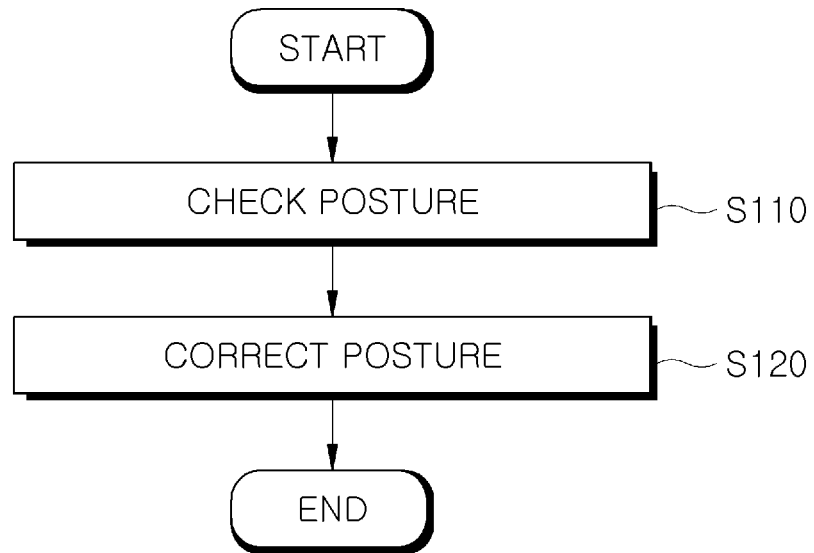

As shown in FIG. 9, the method may include preparation operation S100, adhesives coating operation S200, primary focal point adjusting operation S300, secondary focal point adjusting operation S400, and adhesives hardening operation S500. In addition, the method may further include adhesives coating and hardening operation S600 of the through hole 510.

Preparation operation S100 may include posture check operation S110 and posture correction operation S120.

In posture check operation S110, a posture of the front body 200 or the substrate unit 300 may be checked. In detail, whether the substrate unit 300 or the front body 200 is disposed appropriately for a reference based on a preset reference value.

According to an embodiment, the posture of the substrate unit 300 or the front body 200 may be checked by measuring an angle at which the substrate unit 300 or the front body 200 is tilted based on the preset reference value with respect to axes parallel to at least one direction and/or a distance by which the substrate unit 300 or the front body 200 is spaced apart from the preset reference value in at least one direction.

In detail, the angle at which the substrate unit 300 or the front body 200 is tilted around axes parallel to the first, second, and third directions and the distance by which the substrate unit 300 or the front body 200 is spaced apart from the preset reference value in the first, second, and third directions may be measured to check the posture of the substrate unit 300 or the front body 200. In posture check operation S110, the posture may be checked using a camera.

In posture correction operation S120, when there is a difference from a preset reference position, the substrate unit 300 or the front body 200 may be moved to the preset reference position to correct the posture thereof in consideration of the tilt angle and/or the spaced distance that are measured in posture check operation S110.

In this case, the substrate unit 300 or the front body 200 may be rotated at a tilt angle around axes parallel to at least one direction or may be moved in parallel to at least one direction to correspond to the preset reference value. According to an embodiment, the substrate unit 300 or the front body 200 may be rotated around axes parallel to the first, second, and third directions and may be moved in parallel to the first, second, and third directions.

Figure 11:
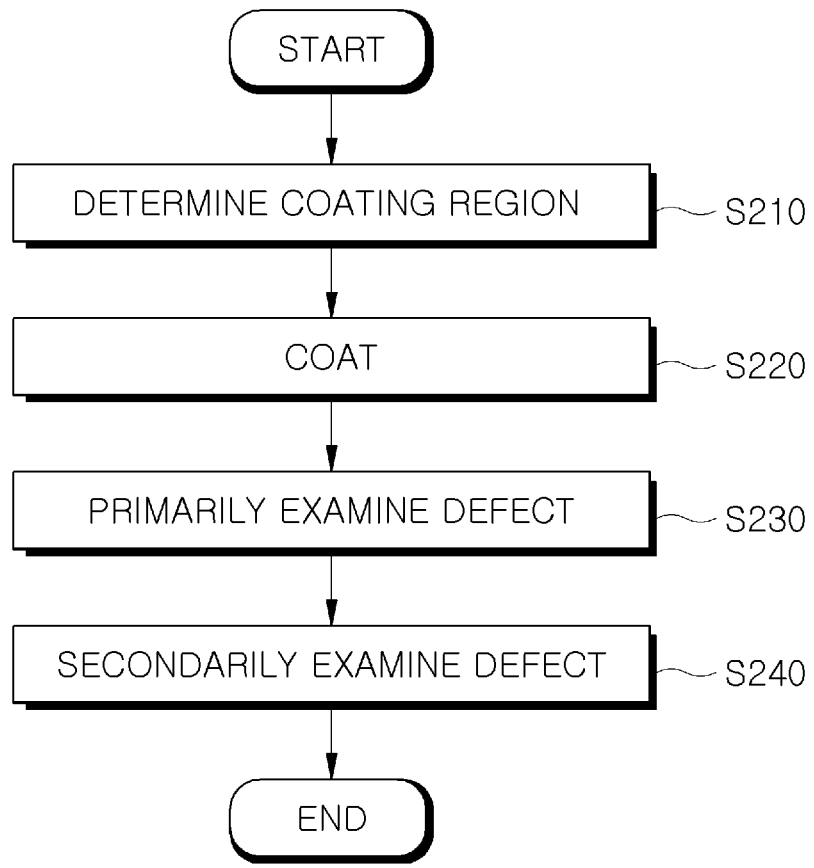

In adhesives coating operation S200, adhesives may be coated on the first adhesive surface 211 formed on the front body 200 or the second adhesive surface 311 formed on the substrate unit 300 and, as shown in FIG. 11, adhesives coating operation S200 may include coating region determination operation S210, coating operation S220, and a defect examination operation. The defect examination operation may include first defect examination operation S230 and second defect examination operation S240.

In coating region determination operation S210, a coating region of adhesives may be determined. In detail, in a camera module according to an embodiment, the first adhesive surface 211 or the second adhesive surface 311 may be the coating region of adhesives.

In coating region determination operation S210, a position at which adhesives are actually coated may be determined among the first adhesive surface 211 and/or the second adhesive surface 311. A camera may be used to determine the coated position of adhesives.

When an adhesives coating device is used, information on the coating region may be preset in the adhesives coating device. Accordingly, the first adhesive surface 211 and/or the second adhesive surface 311 may be completely disposed at the preset position in preparation operation S100 and, the adhesives coating device may perform coating on the coting region that is present in the first adhesive surface 211 and/or the second adhesive surface 311.

In coating operation S220, the adhesives may be coated on the coating region. In the camera module according to an embodiment, the adhesives may be coated using the adhesives coating device in consideration of a small coating area, a rapid process, and the like.

After coating operation S220, the defect examination operation may be performed. In the defect examination operation, whether the coated adhesives is coated on the preset coating region, whether the adhesives are uniformly coated, whether a proper amount of adhesives are coated, whether a defect is present in the image sensor 400, or the like may be examined.

Whether a defect is present in the image sensor 400 may be examined by examining issues that may occur due to coating of adhesives. For example, whether a portion of the image sensor 400 is stained with epoxy or the like may be determined. The defect examination operation may include a plurality of defect examination operations. According to an embodiment, the defect examination operation may be performed by performing first defect examination operation S230 and second defect examination operation S240.

In first defect examination operation S230, whether a defect is present in the coated adhesives may be examined. In detail, in first defect examination operation S230, whether the coated adhesives are coated on the preset coating region, whether the adhesives are uniformly coated, whether a proper amount of adhesives are coated, or the like may be examined. When a defect is discovered in the coated adhesives, the defect may be removed by re-performing coating or additionally performing coating.

In second defect examination operation S240, whether a defect is present in the image sensor 400 may be determined. During a coating procedure of adhesives, the adhesives may be coated on the image sensor 400 and, thus, whether a defect occurs in the image sensor 400 due to coating of adhesives on the image sensor 400 may be examined.

In detail, in second defect examination operation S240, whether a pixel included in the image sensor 400 is damaged, whether adhesives are coated on a surface of the image sensor 400, whether the image sensor 400 is normally operated, or the like may be examined. When a defect is discovered on the image sensor 400, the defect may be removed using an appropriate method. Second defect examination operation S240 may include contents in first defect examination operation S230.

The focal point adjusting operation may be performed once but, may be performed twice or more. According to an embodiment, the focal point adjusting operation may include primary focal point adjusting operation S300 and secondary focal point adjusting operation S400.

In primary focal point adjusting operation S300, a position of the substrate unit 300 may be adjusted to acquire information on focal points at a plurality of positions, positions of the substrate unit 300 and/or the front body 200 may be determined based on the acquired information on the focal points, the positions of the substrate unit 300 or the front body 200 may be adjusted according to the determined positions, and the substrate unit 300 or the front body 200 may be positioned at the determined positions.

Figure 12:
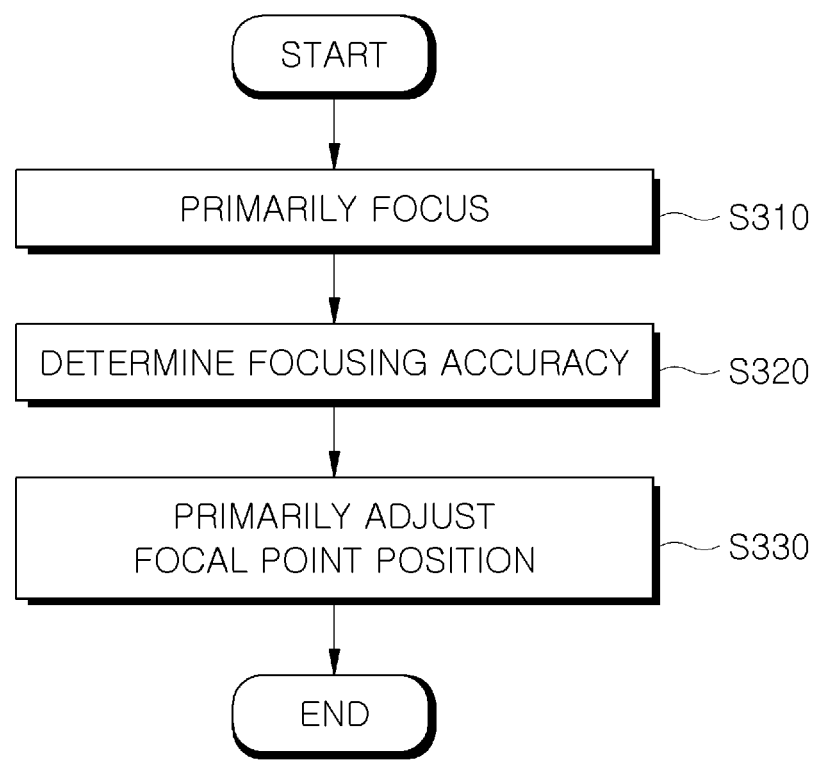

In primary focal point adjusting operation S300, a focal point of the lens unit 100 may be positioned in an enable region of the image sensor 400 and, as shown in FIG. 12, primary focal point adjusting operation S300 may include primary focusing operation S310, focusing accuracy determination operation S320, and primary focal point position adjusting operation S330.

In primary focusing operation S310, the camera module may be focused at a focal point. In detail, in primary focusing operation S310, the substrate unit 300 may be moved in at least one direction, for example, in the first direction to position the focal point of the lens unit 100 in the enable region of the image sensor 400.

In focusing accuracy determination operation S320, primary focusing operation S310 may be performed and, then, a focusing position determined to be appropriate may be determined or identified base on the information acquired in primary focusing operation S310. Primary focusing operation S310 and focusing accuracy determination operation S320 may be performed simultaneously with primary focusing operation S310 or may be performed in the middle of primary focusing operation S310 or, after primary focusing operation S310 is completely performed, focusing accuracy determination operation S320 may be performed.

In focusing accuracy determination operation S320, whether a focal point of the lens unit 100 is positioned in the enable region of the image sensor 400 may be determined. In this case, whether the focal point of the lens unit 100 is positioned in the enable region of the image sensor 400 may be determined by measuring a spatial frequency response (SFR) value of the camera module.

When the SFR value is outside a preset range, primary focusing operation S310 may be repeatedly performed again in such a way that the SFR value is within the preset range.

In primary focal point position adjusting operation S330, the substrate unit 300 may be moved in parallel to at least one direction and/or may be rotated around at least one axis to position the focal point of the lens unit 100 in the enable region of the image sensor 400.

In primary focusing operation S310, the focal point of the lens unit 100 may be adjusted in at least one direction, that is, for example, in the first direction to position the focal point of the lens unit 100 in the enable region of the image sensor 400.

In primary focal point position adjusting operation S330, the focal point of the lens unit 100 may be adjusted in at least one direction to position the focal point of the lens unit 100 in the enable region of the image sensor 400. According to an embodiment, the lens unit 100 may be adjusted in the first, second, and third directions to position the focal point of the lens unit 100 in the enable region of the image sensor 400.

To this end, according to an embodiment, the substrate unit 300 may be moved in parallel to the first, second, and third directions and may be rotated around axes parallel to the first, second, and third directions.

After primary focal point position adjusting operation S330 is performed, the SFR value may be re-measured. When the SFR value is outside a preset range, primary focal point position adjusting operation S330 may be repeatedly performed again in such a way that the SFR value is within the preset range.

When primary focusing operation S310 and primary focal point position adjusting operation S330 are performed, the focal point of the lens unit 100 may be positioned in the enable region of the image sensor 400 in the first, second, and third directions.

In secondary focal point adjusting operation S400, the substrate unit 300 or the front body 200 may be moved in parallel to at least one direction or may be rotated around at least one axis to adjust a position of the image sensor 400, at which the focal point of the lens unit 100 is disposed.

According to an embodiment, the substrate unit 300 may be moved in parallel and may be rotated to adjust the position of the image sensor 400, at which the focal point of the lens unit 100 is disposed.

Figure 13:
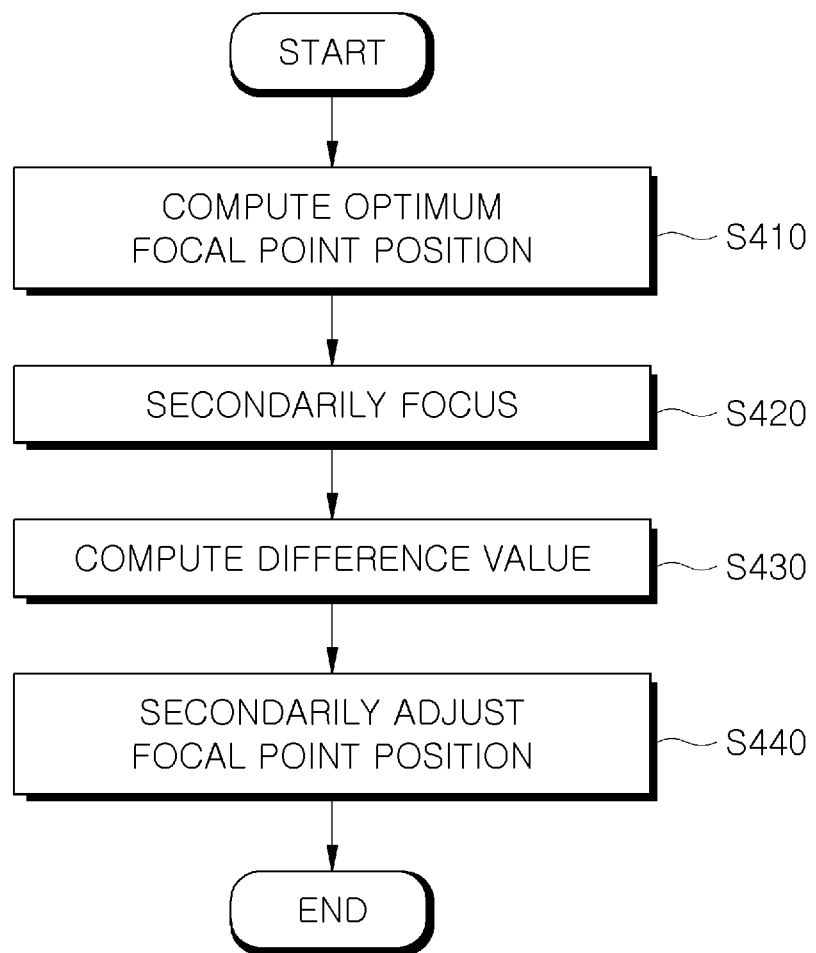

As shown in FIG. 13, secondary focal point adjusting operation S400 may include secondary focusing operation S420, difference value computing operation S430, and secondary focal point position adjusting operation S440. In addition, secondary focal point adjusting operation S400 may further include optimum focal point position computing operation S410.

In optimum focal point position computing operation S410, the SFR value of the camera module may be measured to compute an optimum focal point position of the lens unit 100. That is, in a state in which primary focal point adjusting operation S300 is completely performed, the SFR value of the camera module may be measured and, an optimum focal point position of the lens unit 100 with respect to the image sensor 400 may be computed based on the measurement value.

In this case, the measured SFR value may be measured with respect to portions of an image captured by the image sensor 400 and, thus, may be measured as a plurality of values. For example, a value corresponding to the case in which the image quality of an image is highest may be selected among the plurality of measured SFR values and, the optimum focal point position may be computed based on the selected value.

That is, the optimum focal point position may be computed assuming that the value corresponding to the case in which the image quality of an image is highest among the plurality of measured SFR values is indicated over the entire image.

In secondary focusing operation S420, the camera module may be focused at a focal point and the SFR value may be measured. In detail, in secondary focusing operation S420, the substrate unit 300 may be moved in at least one direction, for example, in the first direction to move the focal point of the lens unit 100 from the enable region of the image sensor 400.

In primary focusing operation S310, the focal point of the lens unit 100 may be positioned in the enable region of the image sensor 400 but, in secondary focusing operation S420, the focal point of the lens unit 100 may be moved not to deviate from the enable region of the image sensor 400 and, thus, in secondary focusing operation S420, the substrate unit 300 needs to be more precisely moved in the first direction by a smaller distance than in primary focusing operation S310.

In difference value computing operation S430, a difference value between the optimum focal point position of the lens unit 100, computed in optimum focal point position computing operation S410, and the focal point position of the lens unit 100, measured in secondary focusing operation S420, may be computed.

In secondary focal point position adjusting operation S440, the substrate unit 300 may be moved in parallel and/or may be rotated to remove the difference value of the focal point position of the lens unit 100 and, thus, the focal point position of the lens unit 100 may be disposed at the optimum focal point position.

That is, in secondary focal point position adjusting operation S440, the substrate unit 300 may be rotated around axes parallel to the first, second, and third directions and may be moved in parallel to the first, second, and third directions to dispose the focal point position of the lens unit 100 at the optimum focal point position or to dispose the focal point position of the lens unit 100 at a position that is spaced apart from the optimum focal point position within a preset error range.

In adhesives hardening operation S500, the adhesives may be hardened using UV and heat and, adhesives hardening operation S500 may include at least one SFR value measuring operation, at least one substrate unit moving operation, and at least one hardening operation.

Figure 14:
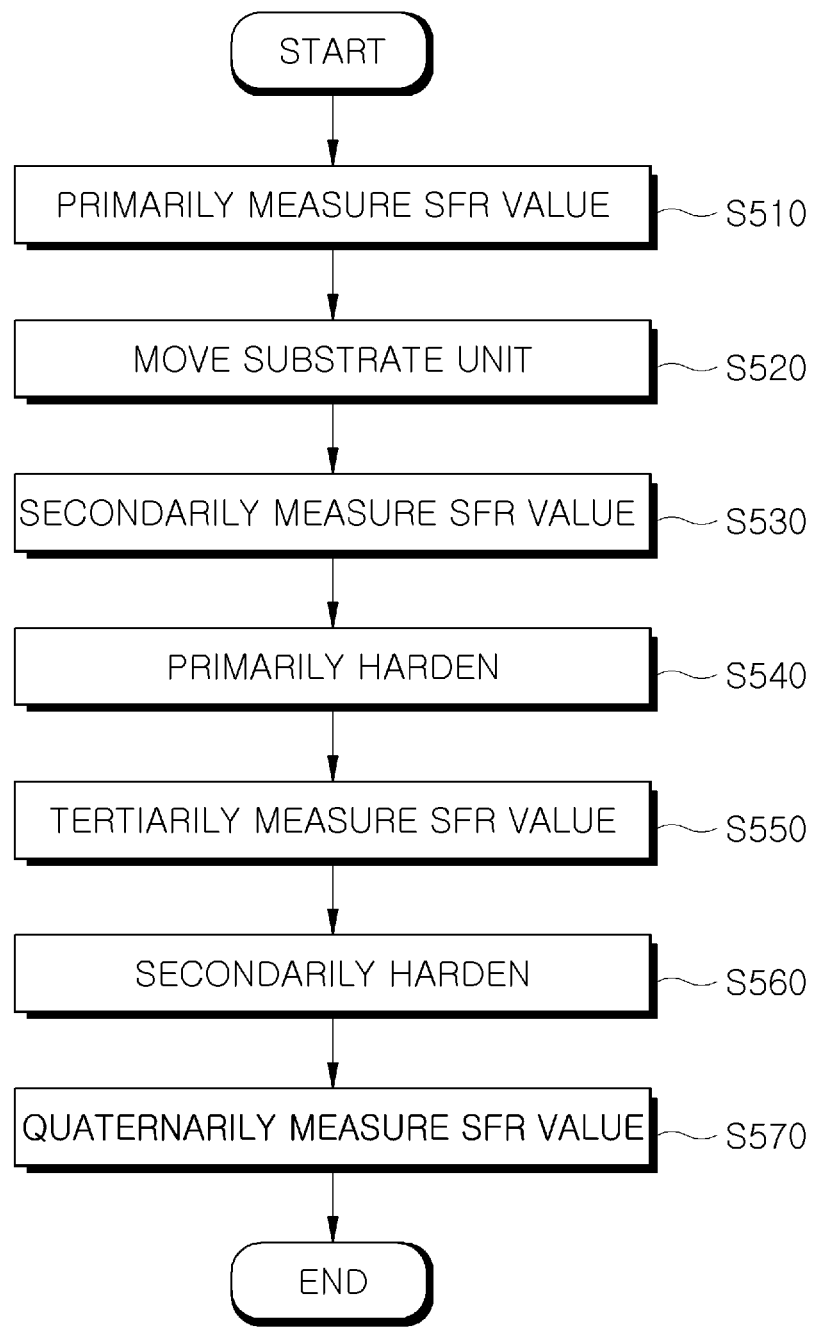

According to an embodiment, in adhesives hardening operation S500, the adhesives may be hardened using UV and heat and, as shown in FIG. 14, adhesives hardening operation S500 may include primary SFR value measuring operation S510, moving operation S520 of the substrate unit 300, secondary SFR value measuring operation S530, primary hardening operation S540, tertiary SFR value measuring operation S550, secondary hardening operation S560, and quaternary SFR value measuring operation S570.

In primary SFR value measuring operation S510, the SFR value of the camera module may be measured to check the first direction focal point position of the lens unit 100.

In moving operation S520 of the substrate unit 300, the substrate unit 300 may be moved in at least one direction, for example, in the first direction to adjust a distance by which the lens unit 100 and the substrate unit 300 are spaced apart from each other in the first direction.

In secondary SFR value measuring operation S530, the SFR value of the camera module may be measured to check whether the substrate unit 300 is moved in the first direction by a preset distance.

When the substrate unit 300 is sufficiently moved or is not sufficiently moved in the first direction, moving operation S520 of the substrate unit 300 and secondary SFR value measuring operation S530 may be repeatedly performed to move the substrate unit 300 in the first direction by a preset distance.

In primary hardening operation S540, UV may be irradiated to the adhesives to pre-harden the adhesives.

In tertiary SFR value measuring operation S550 that is a separate SFR value measuring operation different from primary SFR value measuring operation S510, the SFR value of the camera module may be measured to check whether the first direction focal point position of the lens unit 100 is the same as the measurement result in primary SFR value measuring operation S510 or is within an error range.

When the first direction focal point position of the lens unit 100 is compared with the measurement result in primary SFR value measuring operation S510 and is outside the error range, the adhesives are in a pre-hardened state still and, thus, moving operation S520 of the substrate unit 300, secondary SFR value measuring operation S530, and tertiary SFR value measuring operation S550 may be repeatedly performed in such a way that the first direction focal point position of the lens unit 100 is within the error range. As necessary, primary hardening operation S540 may be performed.

In secondary hardening operation S560, the adhesives may be heated to permanently harden the adhesives.

In quaternary SFR value measuring operation S570, after secondary hardening operation S560 is performed, the SFR value of the camera module may be measured to lastly check whether the first direction focal point position of the lens unit 100 is the same as the measurement result in primary SFR value measuring operation S510 or is within the error range.

The method may include adhesives coating and hardening operation S600 of the through hole after adhesives hardening operation S500 is performed.

When gas in an internal space formed by the front body 200 and the first substrate 310 is thermally hardened in adhesives hardening operation S500, various issues may occur while the internal gas expands.

To overcome this, the through hole 510 for connecting the space formed by the first substrate 310 and the front body 200 and the other space may be formed in the first substrate 310 and/or the front body 200, or adhesives may be coated in the form of an open curve and internal gas that thermally expands may be discharged to the outside using a portion on which the adhesives are not coated, as the through hole 510.

However, after the thermal hardening operation is performed, impurities or the like may penetrate from the outside through the through hole 510 and, thus, the through hole 510 needs to be blocked.

Accordingly, the method may further include adhesives coating and hardening operation S600 of the through hole of filling the through hole 510 with adhesives, tape, or the like. The adhesives may be epoxy or the like and may be epoxy to be hardened by irradiating UV.

Adhesives coating and hardening operation S600 of the through hole may be performed to form a second adhesive unit filled in the through hole 510.

According to an embodiment, the front body 200 and the substrate unit 300 of the camera module may be coupled through the active align procedure and, thus, a focal point of the lens unit 100 coupled to the front body 200 at an optimum position of the image sensor 400 installed on the substrate unit 300 and, thus, the image quality of an image captured by the camera module may be enhanced.

Although only several embodiments have been described above, various other embodiments are possible. The technical ideas of the embodiments described above may be combined into various forms unless they are incompatible techniques, and thereby new embodiments may be realized.

INDUSTRIAL APPLICABILITY

According to embodiments, when air that is filled in a space formed by the front body and the substrate unit expands while the first adhesive unit is heated in order to be hardened, some of the filled air may be discharged to the outside through the through hole and, accordingly, change in a focal distance of the camera module outside a design range, deformation and damage of the first adhesive unit or the substrate unit and the like due to expansion of air may be prevented.

The invention claimed is:

1. A camera module comprising:
a lens unit;
a front body with the lens unit installed thereon;
a substrate unit spaced apart from the lens unit in a first direction and coupled to the front body;
an image sensor disposed on the substrate unit and configured to face the lens unit;
a first coupling element having one side inserted into the front body and configured to couple at least a portion of the substrate unit to the front body; and
a first adhesive unit disposed between the front body and the substrate unit,
wherein the first adhesive unit couples the front body and the substrate unit and includes at least one through hole formed between the front body and the substrate unit,
wherein the substrate unit includes:
a first substrate having a first substrate surface on which the image sensor is installed and that is disposed to face the lens unit, and a second substrate surface; and
a second substrate disposed to be spaced apart from the first substrate in the first direction, and having a third substrate surface to face the second substrate surface of the first substrate, and a fourth substrate surface.

2. The camera module of claim 1, wherein the first substrate is coupled to the front body by the first adhesive unit and the second substrate is coupled to the front body by the first coupling element.

3. The camera module of claim 2, wherein:
the front body includes a first protrusion that protrudes in a direction toward the first substrate and includes a first adhesive surface at an end of the first protrusion;
the first substrate includes a second adhesive surface at a portion facing the first adhesive surface; and
the first adhesive unit is disposed between the first adhesive surface and the second adhesive surface.

4. The camera module of claim 3, wherein the front body includes a second protrusion protruding from the first protrusion in a direction toward the second substrate and including a first insertion groove that is formed therein and into which one side of the first coupling element is inserted.

5. The camera module of claim 3, wherein the first adhesive unit is configured on the second adhesive surface to surround the image sensor.

6. The camera module of claim 3, wherein, the second adhesive surface have a shape corresponding to a shape of the first adhesive surface.

7. The camera module of claim 2, wherein a first through hole that the first coupling element penetrates is formed in the second substrate.

8. The camera module of claim 1, further comprising a second adhesive unit filled in the through hole.

9. The camera module of claim 4, wherein the first substrate comprises a first escape groove having a shape corresponding to the second protrusion.

10. The camera module of claim 4, wherein the second substrate is coupled to the second protrusion by the first coupling element.

11. The camera module of claim 4, wherein the second protrusion is configured to space the first substrate and the second substrate apart from each other in the first direction by a predetermined distance.

12. The camera module of claim 3, further comprising an oxide film formed on the first adhesive surface.

13. The camera module of claim 1, wherein the first adhesive unit is formed of thermosetting and ultraviolet curable material.

14. The camera module of claim 1, further comprising a rear body coupled to the front body and configured to accommodate the substrate unit and the image sensor.

15. The camera module of claim 1, wherein the front body comprising:
a first surface facing the lens unit;
a second surface opposite to the first surface; and
a first protrusion protruding from the second surface in a direction toward the substrate unit,
wherein the first adhesive unit is disposed between the first protrusion and the substrate unit.

16. The camera module of claim 1, wherein the front body comprising:
a first surface facing the lens unit;
a second surface opposite to the first surface; and
a first protrusion protruding from the second surface in a direction toward the first substrate,
wherein the first adhesive unit is disposed between the first protrusion and the first substrate surface of the first substrate.

17. The camera module of claim 6, wherein the at least one through hole comprises a plurality of through holes spaced apart from each other.

18. A camera module comprising:
a front body;
a lens unit coupled to the front body, wherein the lens unit is installed on the front body;
a substrate unit coupled to the front body;
an image sensor disposed on the substrate unit; and
an adhesive unit coupling the front body and the substrate unit,
wherein the front body comprises a first surface facing the lens unit, a second surface opposite to the first surface, and a protrusion protruding from the second surface in a direction toward the substrate unit,
wherein the adhesive unit is disposed between the protrusion and the substrate unit.

19. A camera module comprising:
a lens unit;
a front body with the lens unit installed thereon;
a substrate unit spaced apart from the lens unit in a first direction and coupled to the front body;
an image sensor disposed on the substrate unit and configured to face the lens unit;
a first coupling element having one side inserted into the front body and configured to couple at least a portion of the substrate unit to the front body;
a first adhesive unit disposed between the front body and the substrate unit, configured to couple the front body and the substrate unit, and including at least one through hole formed between the front body and the substrate unit; and a rear body coupled to the front body and configured to accommodate the substrate unit and the image sensor, wherein the substrate unit includes a first substrate having a first substrate surface on which the image sensor is installed and that is disposed to face the lens unit, and a second substrate surface, and at least one second substrate disposed to be spaced apart from the first substrate in the first direction, and having a third substrate surface to face the second substrate surface of the first substrate, and a fourth substrate surface; and the front body includes a first protrusion that protrudes in a direction toward the first substrate surface of the first substrate, includes a first adhesive surface at an end of the first protrusion, and includes an oxide film that is formed on the first adhesive surface.

20. The camera module of claim 18, wherein the substrate unit includes:

a first substrate having a first substrate surface on which the image sensor is installed and that is disposed to face the lens unit, and a second substrate surface; and a second substrate disposed to be spaced apart from the first substrate in the first direction, and having a third substrate surface to face the second substrate surface of the first substrate, and a fourth substrate surface.

* * * * *